United States Patent [19]

Krajewski et al.

[11] Patent Number: 5,106,310

[45] Date of Patent: Apr. 21, 1992

[54] Z-AXIS PIN CONNECTORS FOR STACKED PRINTED CIRCUIT BOARD ASSEMBLIES

[75] Inventors: Nicholas J. Krajewski; David J. Johnson, both of Chippewa Falls; Arthur O. Kunstmann, Weyerhauser, all of Wis.

[73] Assignee: Cray Research, Inc., Eagan, Minn.

[21] Appl. No.: 606,577

[22] Filed: Oct. 31, 1990

Related U.S. Application Data

[62] Division of Ser. No. 514,865, Apr. 26, 1990.

[51] Int. Cl.⁵ .............................................. H01R 9/09
[52] U.S. Cl. ...................... 439/75; 439/751; 439/931
[58] Field of Search .................. 439/82, 74, 75, 66, 439/825, 592, 593, 931, 751; 29/830

[56] References Cited

U.S. PATENT DOCUMENTS

| | | | |
|---|---|---|---|
| 2,926,340 | 2/1960 | Blain et al. | 29/830 |
| 3,319,217 | 5/1967 | Phillips | 439/75 |
| 3,400,358 | 9/1968 | Byrnes et al. | 439/786 |
| 3,404,370 | 10/1968 | Bryner et al. | 439/593 |
| 3,634,819 | 1/1972 | Evans | 439/825 |
| 3,853,377 | 12/1974 | Shlesinger, Jr. | 439/593 |
| 4,155,321 | 5/1979 | Tamburro | 29/830 |
| 4,889,496 | 12/1989 | Neidich | 439/75 |
| 4,969,259 | 11/1990 | Macek et al. | 439/82 |

OTHER PUBLICATIONS

Cray Research, Inc. drawing number C3-0025, dated Oct. 5, 1985. (Labeled Exhibit A).
Cray Research, Inc. drawing number C3-0038, dated Oct. 18, 1985, (Labelled Exhibit B).
Cray Research, Inc. drawing number C3-0039, dated Oct. 21, 1985, (Labelled Exhibit C).
Cray Research, Inc. drawing number C3-0043, dated Oct. 25, 1985, (Labelled Exhibit D).
Cray Research, Inc. drawing number C3-0040, dated Oct. 21, 1985, (Labelled Exhibit E).

Primary Examiner—Neil Abrams
Attorney, Agent, or Firm—Merchant, Gould, Smith, Edell, Welter & Schmidt

[57] ABSTRACT

Z-axis pin connectors for interconnecting stacked printed circuit boards are formed from resilient material and have contact sections larger than cooperating through-plated holes formed in the boards. The pin connectors are drawn through the through-plated holes in the stacked circuit board, causing the contact section of the pin connector to frictionally engage the through-plated holes on at least two boards. Formation of pin connectors from a resilient thermoplastic material coated with a conductive layer is also disclosed.

7 Claims, 3 Drawing Sheets

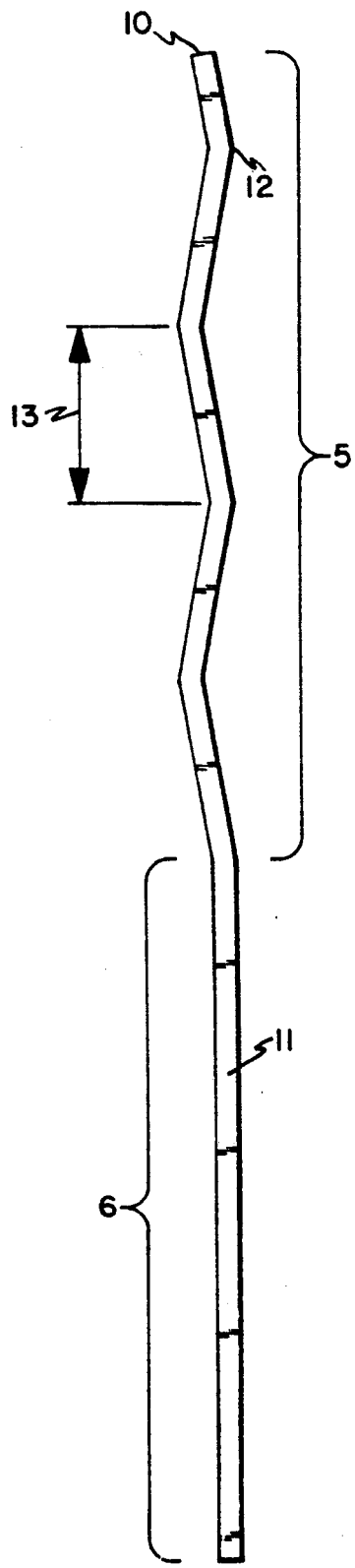
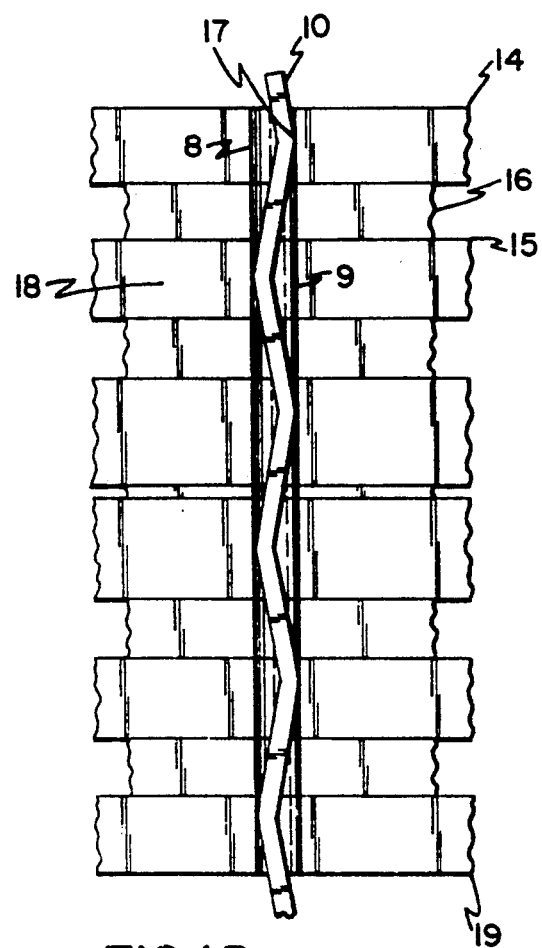
FIG.1A
FIG.1B

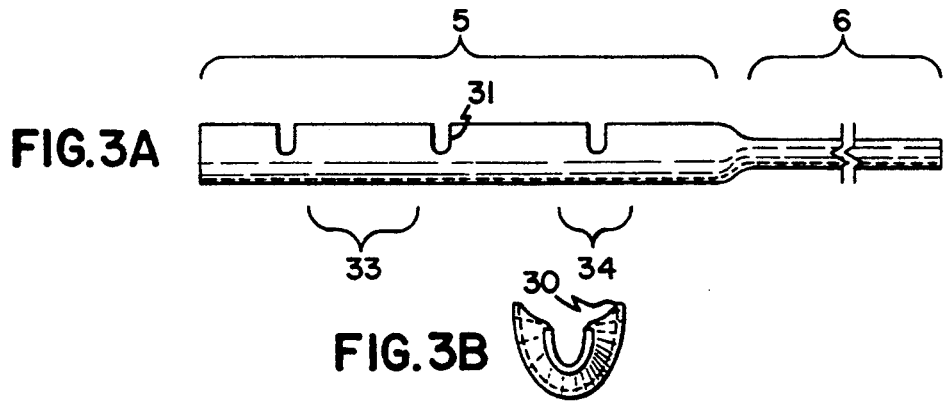
FIG. 3A
FIG. 3B
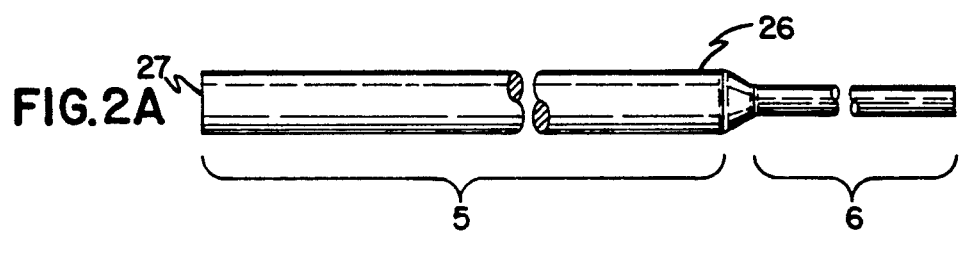
FIG. 2A
FIG. 2B
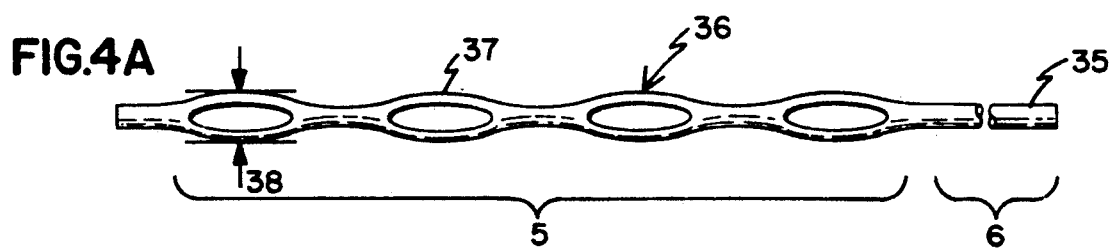
FIG. 4A
FIG. 4B

Z-AXIS PIN CONNECTORS FOR STACKED PRINTED CIRCUIT BOARD ASSEMBLIES

This is a division of application Ser. No. 07/514,865, filed Apr. 26, 1990.

FIELD OF THE INVENTION

The present invention relates to the field of electrical circuit connectors, and more specifically to a method and apparatus for interconnecting stacked circuit boards.

BACKGROUND OF THE INVENTION

In a conventional electronic layout, printed circuit boards are used to interconnect integrated circuits. The integrated circuits are coupled to conductive foil patterns located on the circuit boards. This interconnection level is coplanar with the circuit board and defines an X—Y interconnection plane.

When a single board cannot hold all of the circuit components, because of size or required signal flow constraints, several circuit boards may be arranged and interconnected in a number of configurations. One common high density interconnect configuration is a stack of circuit boards which are electrically interconnected with interboard connectors. This corresponds to electrical interconnection in the Z-axis. This three-dimensional packing scheme creates a compact module assembly that has a density limited by heat dissipation and connector spacing requirements.

Although many interboard connectors are suitable for interconnecting stacked circuit boards. Many of these connectors limit the inter-board spacing of stacked circuit boards. This is undesirable in high speed applications where signal timing needs depends solely on the signal path lengths. The longest of these paths is termed the "critical path length." To increase operating speed the critical path length must be reduced.

Z-axis interconnectors address this need. For example U.S Pat. No. 4,813,128 issued to Massopust, and assigned to the assignee of the present invention, teaches a method of interconnecting circuit boards using blocks and Z-axis pins. This type of interconnection scheme reduces the average signal path as compared to a conventional edge type connectors. However, the Massopust structure does not minimize the critical path length because the presence of the blocks limits inter-board spacing. As a consequence, the number of connection points is comparable to the number exhibited by an edge connector.

Other Z-axis connectors are disclosed in U.S. Pat. No. 3,097,032 issued to Hochheiser, and U.S. Pat. No. 2,969,521 issued to Scoville. While the Hochheiser and Scoville inventions do not use blocks, the number of connection points to interconnect the circuit boards is similar to that of the edge connector, the critical path length is limited by the fork height requirements. Additionally, the use of the inventions require the extra step of placing the contacts on the board.

A Z-axis connection scheme that addresses the critical path length limitations is described in U.S. Pat. No. 3,212,049, issued to Mittler et al. Mittler et al. describes a scheme where contact bushings are installed in circuit board holes and placed in electrical contact with the circuit board foil patterns. The circuit boards are then stacked and Z-axis pins are run through the aligned bushings to interconnect the boards. While the Mittler patent allows a short critical path length, the insertion of bushings into the circuit boards adds complexity and reduces component density. Additionally, the number of contact points remains the same as in the edge connector.

Another Z-axis connection scheme that addresses the critical path length limitations is described in U.S. Pat. No. 3,867,759, issued to Siefker. Siefker describes a method of soldering Z-axis wires in place for stacked strip-line circuits.

SUMMARY OF THE INVENTION

The present invention describes a class of Z-axis pin connectors useful for interconnecting a dense module of stacked circuit boards in a manner that permits high speed operation by reducing critical signal path lengths and that minimizes the number of contact points. The described Z-axis pin connectors are inserted into axially aligned through-plated holes on the circuit boards.

The circuit boards used with the present invention are manufactured with through-plated holes electrically connected to a prefabricated foil pattern lying in the X—Y plane. The prefabricated foil pattern connects to integrated circuit bonding pads having integrated circuit chips mounted thereon. The circuit boards are then stacked together in a module assembly.

The module assembly is electrically interconnected by inserting Z-axis pin connectors into the axially aligned through-plated holes on the circuit boards. By using the Z-axis pin connectors and the X—Y orientated foil patterns a three dimensional signal routing scheme is created. Proper layout of the components on the circuit boards and the through-plated holes, the critical timing path distance can be reduced over that of standard two dimensional routing schemes.

A number of illustrative embodiments of the Z-axis connector are disclosed. These various designs share several similarities.

The Z-axis pin connectors are constructed with resilient contact sections that are radially larger than the circuit board through-plated holes. When inserted into the through-plated holes, the contact section compress against the walls of the through-plated holes, creating a frictional contact. This frictional contact creates a low resistance electrical connections between the Z-axis pin connector and the circuit board. Since the Z-axis pin connector is electrically conductive, the circuit boards connecting to the Z-axis pin connector are electrically interconnected.

To assist in installing the Z-axis pin connectors, a leader section is added to the contact section. The leader has a smaller diameter than the through-plated holes. In operation the leader section is inserted into the through-plated holes, and is drawn through the stack of circuit boards. This operation places the connector under tension while the pin is forced into contact with the plated through holes of the circuit board stack.

BRIEF DESCRIPTION OF THE DRAWINGS

Having briefly discussed the inventions, they will be better understood from the detailed discussion of the inventions that follows taken in conjunction with the attached drawings, wherein:

FIG. 1A is an elevational view of a kinked pin Z-axis connector;

FIG. 1B is a cut-away view of a Z-axis connector installed in a module assembly;

FIG. 2A is an elevational view of an elliptically shaped tubular embodiment of the Z-axis connector and leader section.

FIG. 2B is a cross-sectional view of the Z-axis connector depicted in FIG.2A

FIG. 3A is an elevational view of an arched shaped embodiment of the Z-axis connector and leader section.

FIG. 3B is a cross-sectional view of the Z-axis connector depicted in FIG.3A.

FIG. 4A is an elevational view of a furcated embodiment of the Z-axis connector.

FIG. 4B is a cross-sectional view of the Z-axis connector depicted in FIG.4A.

DETAILED DESCRIPTION OF THE PREFERRED EMBODIMENT

Figure 5A:
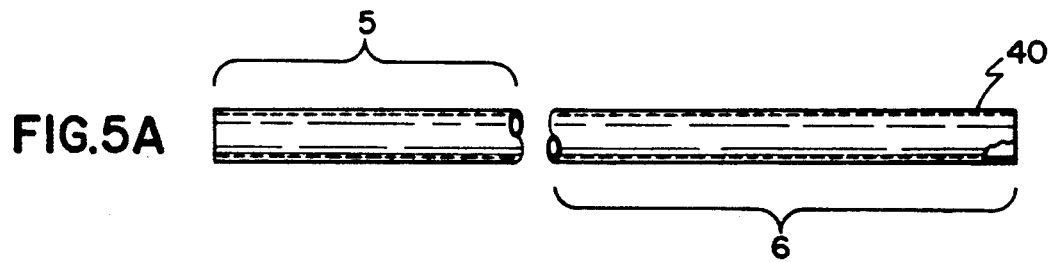
FIG. 5A is an elevational view of a tubular embodiment of the Z-axis connector.
Figure 5B:
FIG. 5B is a cross-sectional view of the Z-axis connector depicted in FIG.5A.

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The z-axis connector illustrated in the various embodiments depicted in the figures is intended for use in the construction of high speed electronic machines such as supercomputers such as the type manufactured by Cray Research, Inc., the assignee of the present invention. Very fast supercomputers rely on high density packaging techniques to place the active semiconductor circuits in close proximity to each other. Some packaging strategies place passivated dice directly on printed circuit boards and then stack a number of such boards into a module assembly. To optimize this strategy it is important that the connectors be made as small as practical. The Z-axis connectors of this invention are used to interconnect holes having a diameter of approximately 0.006 inches. To use such small connectors it is preferred to insert the connectors into plated-though holes formed in the printed circuit boards and drawing the electrical connection section of the connector into contact with the plated section of the hole.

Reference may be had to U.S. patent application Ser. No. 07/053,142 filed May 21, 1987 entitled "Lead Bonding of Chips onto Circuit Boards and Circuit Boards to Circuit Boards", U.S. patent application Ser. No. 07/324,906 filed Mar. 17, 1989 entitled "Memory Metal Connector Pin for Connecting Circuit Boards to Circuit Boards", U.S. patent application Ser. No. 07/347,507 filed May 4, 1989 entitled "Twisted Wire Jumper Electrical Interconnector", U.S. patent application Ser. No. 07/335,484 filed Apr. 10, 1989 entitled "Compressible Core Twist Pin Connector", which relate to the same general subject matter and which are incorporated by reference herein.

In general terms, each of the Z-axis connectors described herein in conjunction with the preferred embodiments of the present invention has a resting or relaxed state corresponding to minimum energy. This minimum energy state is exhibited when the connector is not inserted into the module. Work is performed during insertion of the connector into the module. Some energy is stored by deformation of the connector during the insertion process. This stored energy assists in maintaining a reliable electrical connection. Each pin has both a leader section 6 which is used for insertion and an interconnection section 5 which remains within the module. The interconnection section has a contact portion and a spacer portion. In operation, the contact portion frictionally engages the plated through holes while the spacer portion resides in the interboard spacers.

Turning to FIG. 1A there is shown a kinked pin embodiment of the present invention. The preferred material for the pin is beryllium copper alloy which exhibits a relatively high spring constant. The kinked wire body 10 has a uniform circular section of approximately 0.002 inches, and is made from a conductive metallic material exhibiting a spring constant sufficient to provide resilient contact when it is elastically deformed. It is preferred to make this pin from a copper beryllium copper alloy which is gold plated. The pin has a leader section 11 which is generally straight. The length of this leader section should be sufficient to permit the leader section to pass completely through the stacked circuit boards and is preferably 0.175 inches. The pin 10 has a plurality of bends formed along the length of the pin, one such bend is depicted at 12. The spacing of the bends 13 corresponds to the interboard spacing of the module and is preferably 0.0277 inches. Upon insertion into the module the bends deform into contact with the plated through holes of the boards defining contact sections 8. It is important to note that the pin does not undergo plastic deformation in the insertion process, and the contact sections are urged into conformity with the holes through the resilience of the pin material.

Turning to FIG. 1B, the pin 10 is shown inserted into a stack of circuit boards. The circuit boards have plated-through holes as shown at 8 and 9 to permit electrical interconnection with the board. Individual boards such as 14 and 15 are connected by the deformed pin which provides contact sections 17 and 18. The boards 14 and 15 are separated by a spacer 16. In some applications, it may be important that the spacer not contact the pin 10 since contact would reduce the force exhibited by the contact section. The relatively large distance between contact sections allows this form of pin to tolerate a relatively large amount of misalignment of the through plated holes. This is of practical value since there is some misalignment of the boards within the module. As shown in FIG. 1B, the leader section is removed after insertion of the pin into the module. It may be desirable to leave a small portion of the pin extending beyond the board 19 to facilitate removal of the pin. It is also preferable to have all the bends in one plane so that the pin may deform torsionally to relive and equalize stress at the contact sections to promote good electrical contact.

Turning to FIG. 2A there is shown a tubular embodiment of the Z-axis pin connector. In this instance it is preferred to make the pin from a resilient thermoplastic material such as nylon and to provide a conductive layer by sputtering gold onto the surface of the tube. A conductive layer 26 may be sputtered onto the outer periphery of the tube 27. Although any one of a number of conductive materials could be used it is preferred to use gold as the conductive layer because of its resistance to corrosion and its ductility. The cross-section of FIG. 2B shows a hole running throughout the pin. The purpose of the hole is to provide additional compliance to the pin. The preferred cross-section, as shown in FIG. 2B, for the tube is oval with a major axis slightly smaller than the hole diameter. The preferred major axis dimension is 0.006 inches with a minor axis dimension selected to produce a diameter of 0.0055 inches when deformed into a circular cross-section.

Turning to FIG. 3A, there is shown an unrestrained pin which may be drawn or stamped from a resilient material such as beryllium copper alloy. In cross-section, as shown in FIG. 3B, the pin walls 30 form an arch shape which will deform into contact with the walls of the printed circuit board. It is preferred to form the pin from a thin foil having a thickness of 0.0003 inches. In some applications where there is misalignment of the circuit boards it may be desirable to notch the walls as shown at 31. The function of the notch is to decouple contact sections 33 from the spacer areas 34 of the connector. It is contemplated that the pin may twist during insertion and it is desired that residual torsional stress not affect the contact areas.

Turning to FIG. 4A there is shown a forked or furcated version of the connector pin. In this embodiment a piece of wire 35 is pierced forming a number of forked or furcated sections, one of which is depicted at 36. The preferred shape for the pierced aperture is elliptical with a major axis of approximately 0.015 inches. The minor axis will be sufficient to produce a pin having contact sections 37 which are approximately 0.006 inches wide as shown by dimension 38. In this embodiment it is desirable to have all of the contact sections formed in one plane. As shown in FIG. 4B the preferred cross-section of the connector exhibits rounded contact section contours.

In FIG. 5A there is shown an elliptical tube version of the connector pin 40. In this version, there is a uniform elliptical cross-section with a preferred major axis of 0.0051 inches and a preferred minor axis of 0.0038 inches. It is preferred to form this tube with a uniform wall 42 thickness of 0.0005 inches. These dimensions will result in a tube which will deform into a round shape of 0.0045 inches when deformed into a circular aperture. In this embodiment it is preferred to form the pin from a resilient metallic material which exhibits a spring constant, which, when coupled with the geometry of the pin, cooperate to form resilient contact sections.

Figure 6A:
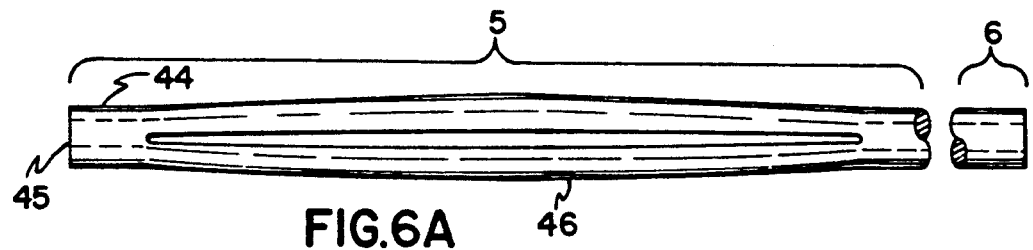
FIG. 6A is a elevational view of a pinched pin embodiment of the Z-axis connector.
Figure 6B:
FIG. 6B is a cross-sectional view of the Z-axis connector depicted in FIG.6A.

Turning to FIG. 6A there is shown a pin 44 which has a variable cross-section which varies from a circular cross-section 45 to an oval or elliptical cross-section 46. This pin may be formed by stamping a 0.0089 inches diameter wire with a piecing tool which displaces the wire into the desired shape. As shown in FIG. 6B the pierced aperture 47 has a uniform cross-section.

Figure 7A:
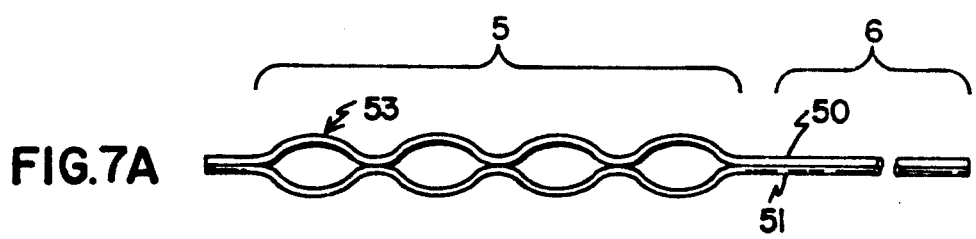
FIG. 7A is a elevational view of a hairpin embodiment of the Z-axis connector having oval shaped apertures formed from a pair of wires.
Figure 7B:
FIG. 7B is a cross-sectional view of the Z-axis connector depicted in FIG.7A.
Figure 7C:
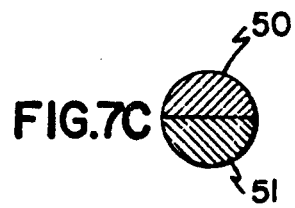
FIG. 7C. is an enlarged section of the leader section of the Z-axis connector of FIG. 7A.

FIG. 7A depicts a hairpin pin which is formed by welding two "D" shaped wires 50 and 51 into a spring pin. The preferred material is beryllium copper. It is preferred to use wire drawn into a D shaped cross-section as shown in the cross-section FIG. 7C. As shown in FIG. 7B it is preferred to form the pin with all the shaped sections 53 in a single plane.

CONCLUSION

Although a specific embodiment has been illustrated and described herein, it will be appreciated by those of ordinary skill in the art that any arrangement which is calculated to achieve the same purpose may be substituted for the specific embodiment shown. For example, different processing steps, different electrical connection patterns, different metals, such as beryllium copper or memory metals such as nickel-titanium, or different barrier metals than those disclosed in the detailed description could be used. This application is intended to cover any adaptations or variations of the present invention. Therefore, it is manifestly intended that this invention be limited only by the claims and the equivalents thereof.

What is claimed is:

1. A conductive Z-axis pin connector for electrically interconnecting a plurality of stacked circuit boards having electrically conductive openings, comprising:

a one-piece, entirely integral contact section having an outer surface with a substantially elliptically shaped cross-section, said elliptical shape having its major axis longer than the dimensions of said openings and its minor axis shorter than the dimensions of said openings; said contact section having a pierced elongated opening through its cross-section disposed substantially along the longitudinal axis of said contact section; said contact section being of an axial length sufficient to electrically interconnect at least two of said stacked circuit boards; said contact section being sufficiently resilient due to said pierced opening to outwardly bias said outer surface into electrical contact with said openings when said pin connector is inserted into said openings; and a leader attached along the longitudinal axis of said contact section, said leader being cross-sectionally dimensioned smaller than said conductive openings and of a sufficient axial length to assist in installing said pin connector in said openings in at least two stacked circuit boards.

2. The apparatus of claim 1, further comprising:

a transition section located between said contact section and said leader, said transition section having, an outer surface that varies monotonically from the entire outer periphery of said contact section to the entire outer periphery of said leader as the location varies from the contact section-transition section interface to the leader-transition section interface.

3. The apparatus of claim 2 wherein the contact section is constructed of a substantially electrically nonconductive material with the outer surface of said contact section being coated with a substantially conductive material.

4. The apparatus of claim 3 wherein said non-conductive material is a resilient, thermo-plastic material.

5. The apparatus of claim 3 wherein said substantially conductive material is primarily gold (Au).

6. The apparatus of claim 1 wherein said contact section is constructed of a resilient metallic material.

7. The apparatus of claim 6 wherein said resilient metallic material is beryllium copper alloy.

* * * * *

UNITED STATES PATENT AND TRADEMARK OFFICE
CERTIFICATE OF CORRECTION

PATENT NO. :    5,106,310
DATED      :    April 21, 1992
INVENTOR(S) :   Krajewski et al.

It is certified that error appears in the above-identified patent and that said Letters Patent is hereby corrected as shown below:

Column 1, line 46 delete "a" after the word "to".

Column 1, line 64 "et al" should read --et al.,--.

Column 2, line 45 delete "a" after the word "creates".

Column 2, line 63 "inventions" should read --invention--.

Column 3, lines 18 and 22 "a" should read --an--.

Column 3, line 40 "z-axis" should read --Z-axis--.

Column 3, line 55 "though" should read --through--.

Column 3, lines 59, 62, 65 and 67 "patent application" should read --Patent Application--.

Column 4, lines 18 and 41 "plated through" should read --plated-through--.

Column 4, line 59 "through plated" should read --through-plated--.

Column 5, line 61 "inches" should read --inch--.

UNITED STATES PATENT AND TRADEMARK OFFICE
CERTIFICATE OF CORRECTION

PATENT NO. : 5,106,310

DATED : April 21, 1992

INVENTOR(S) : Krajewski et al

It is certified that error appears in the above-indentified patent and that said Letters Patent is hereby corrected as shown below:

Column 5, line 68 "D" should read —"D"—

Signed and Sealed this

Second Day of November, 1993

Attest:

BRUCE LEHMAN

Attesting Officer — Commissioner of Patents and Trademarks